United States Patent [19]
Matsuno

[11] Patent Number: 5,942,943
[45] Date of Patent: Aug. 24, 1999

[54] ELECTRICAL POWER AMPLIFIER DEVICE

[75] Inventor: Noriaki Matsuno, Tokyo, Japan

[73] Assignee: NEC Corporation, Tokyo, Japan

[21] Appl. No.: 08/908,980

[22] Filed: Aug. 8, 1997

[30] Foreign Application Priority Data

Aug. 9, 1996 [JP] Japan .................................. 8-211485

[51] Int. Cl.⁶ ...................................................... H03F 3/16
[52] U.S. Cl. ......................... 330/277; 330/302; 330/306
[58] Field of Search ................................... 330/277, 302, 330/303, 306, 307, 296

[56] References Cited

U.S. PATENT DOCUMENTS

| 4,107,621 | 8/1978 | Furutani et al. | 330/306 |
| 5,117,203 | 5/1992 | Tennyson | 330/302 |
| 5,229,732 | 7/1993 | Furutani et al. | 330/306 |
| 5,272,456 | 12/1993 | Ishida | 330/277 |

FOREIGN PATENT DOCUMENTS 406053761  2/1994  Japan .................................... 330/302

*Primary Examiner*—Robert Pascal
*Assistant Examiner*—Khanh Van Nguyen

*Attorney, Agent, or Firm*—Whitham, Curtis & Whitham

[57] ABSTRACT

There is provided an electrical power amplifier device in which an output voltage amplitude is increased without generating any problems such as a reduction of gain, an increasing of loss and providing a large-sized device. The electrical amplifier device of the present invention is operated such that a bias point and a gradient of a load line are set as follows. That is, in the electrical power amplifier device of the present invention, a bias point of a source-grounded field-effect transistor is set to a point where a drain bias current is higher than that of the class A bias point. In addition, in the electrical power amplifier device of the present invention, a gradient of a load line is set to have a relation of a first voltage $V_1$>a second voltage $V_2$. In this case, the first voltage $V_1$ is a voltage obtained by subtracting a power supply voltage $V_{dd}$ from a voltage attained at a crossing point between the load line and the voltage axis. In addition, the second voltage $V_2$ is a voltage obtained by subtracting a knee voltage $V_{knee}$ from the power supply voltage $V_{dd}$. Further, an input voltage where an output voltage wave is saturated at a low voltage side is applied to the electrical power amplifier device of the present invention to operate it.

9 Claims, 11 Drawing Sheets

Fig.13

ELECTRICAL POWER AMPLIFIER DEVICE

BACKGROUND OF THE INVENTION

This invention relates to an electrical power amplifier device operating in a high frequency band as a saturation amplifier device.

In the conventional way an electrical power amplifier device employs DC bias supplying methods such as class A, class AB, class B and class C or the like. The class A is used for determining a bias point in such a way that a load line is always kept within a region where a current of a transistor flows and thus an output waveform when a sinusoidal wave is inputted in respect to the class A electrical power amplifier device designed in this way shows a sinusoidal voltage waveform and a sinusoidal current waveform, respectively. Class B is used for determining that a bias point is set to a threshold voltage of a transistor and an output waveform attained when a sinusoidal wave is inputted in respect to the class B electrical power amplifier device designed in this way becomes such a waveform as one in which only a half-cycle of positive sinusoidal wave is taken out. Comparing it with the class A shows that the class B has a high efficiency but has a poor linear characteristics.

The class AB is used for determining a bias point between the class A and the class B, and an output waveform when a sinusoidal wave is inputted to the class AB electrical power amplifier device designed in this way becomes a waveform in which a lower part of the sinusoidal wave is cut. An efficiency and a linear characteristic are set between the class A and the class B. The class C is used for determining a bias point to a value less than a threshold voltage, wherein an output waveform when a sinusoidal wave is inputted to the class C electrical power amplifier device designed in this way becomes such a waveform as one in which only a part near a top point of the sinusoidal wave is taken out. An efficiency is the highest value and a linear characteristic becomes the lowest one.

In addition, a gradient of the load line may influence against a gain and a saturation output when a low signal is inputted, wherein as a gradient of the load line is increased, the small signal gain is decreased and the saturation output is improved. To the contrary, as the gradient of the load line is decreased, the small signal gain is improved and the saturation output is decreased.

Figure 11:
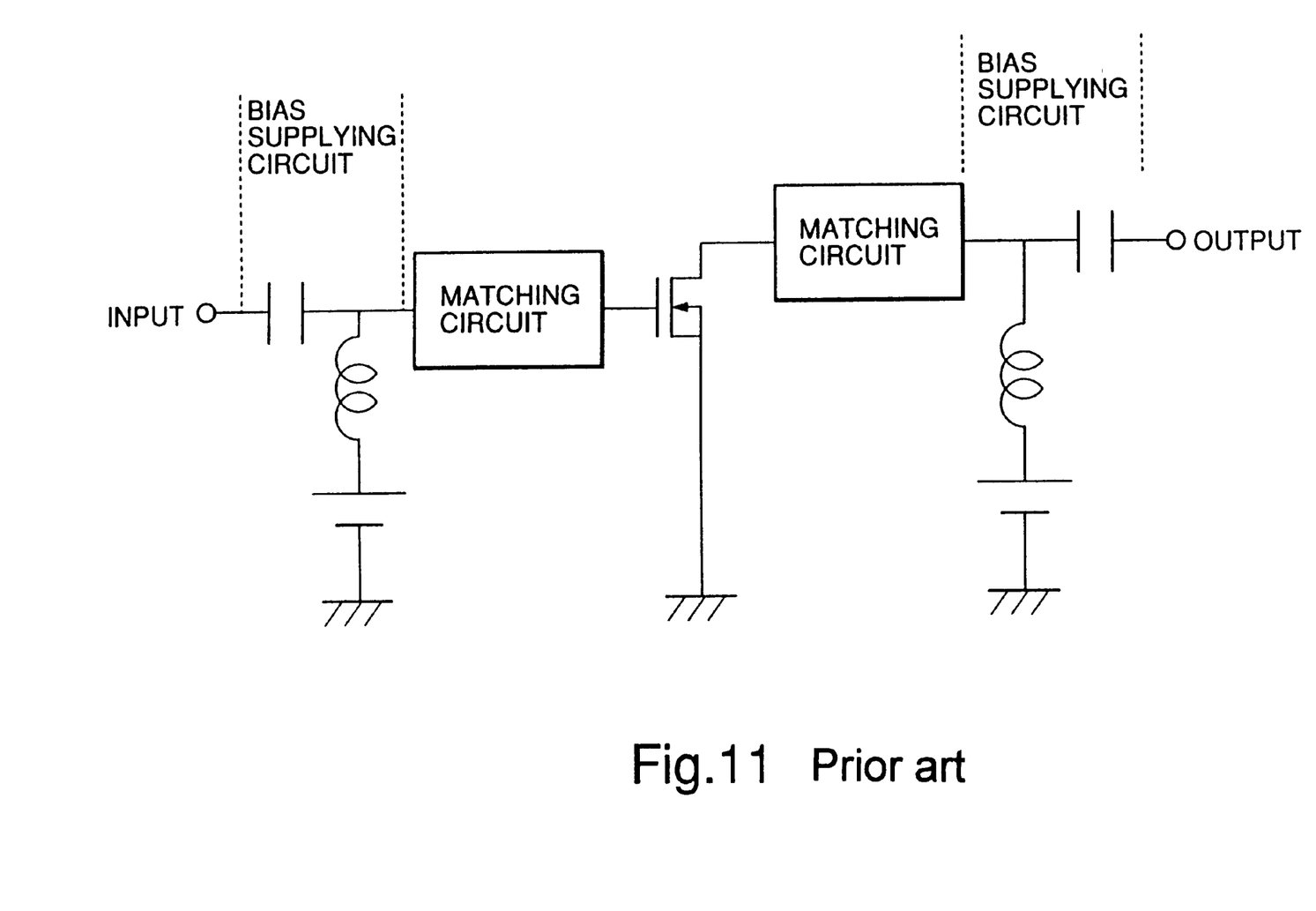
FIG. 11 shows a constitution of the electrical power amplifier device using the prior art.
Figure 12:
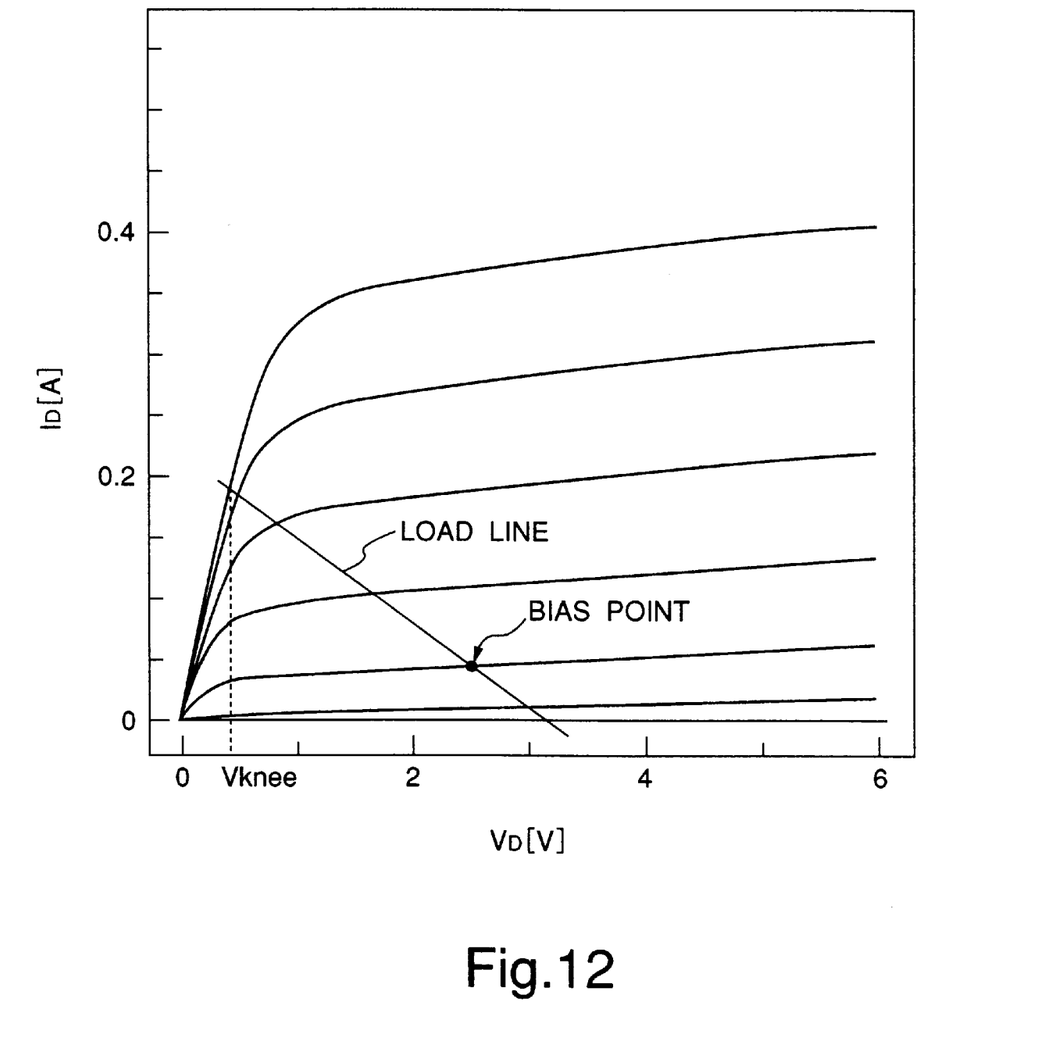
FIG. 12 shows a bias point and a gradient of a load line of the electrical power amplifier device using the prior art.
Figure 13:
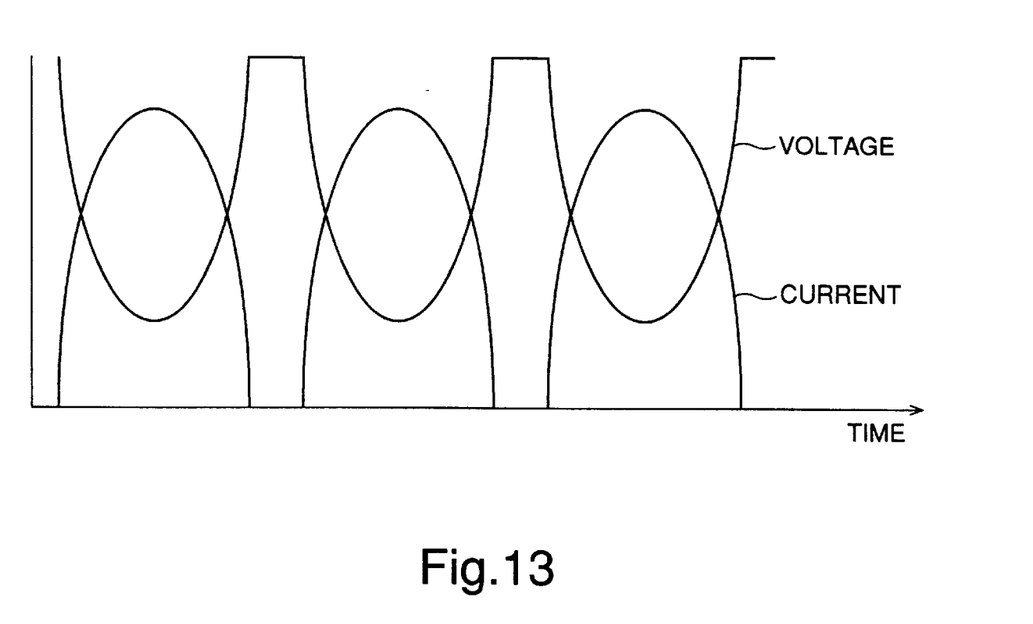
FIG. 13 shows an output voltage waveform and an output current waveform of the electrical power amplifier device using the prior art.

As an example of the prior art, a configuration of the electrical power amplifier device using a source grounded FET biased to the class AB is shown in FIG. 11. In addition, a load line of the same electrical power amplifier device is shown in FIG. 12. Further, both an output voltage waveform and an output current waveform of the same electrical power amplifier device are shown in FIG. 13. The output voltage amplitude in the case of class A has the maximum value at a value twice a voltage having a knee voltage $V_{knee}$ subtracted from the power supply voltage, and the amplitudes in the case of classes AB, B and C are less than this voltage. In this case, the knee voltage V knee is defined as a drain voltage when an increasing of the drain current is stopped.

In the case that it is tried to obtain a higher output electrical power with the same power supply voltage, the prior art employs two kinds of method, i.e. (i) a load impedance is decreased and an output current is increased, and (ii) a size of a transistor is increased and an output current is also increased.

However, as the problems of the prior art, it is possible to show the following problems:

(a) a gain is decreased when a load impedance is decreased;
(b) a loss is increased since a current is increased;
(c) as a gain is decreased and a loss is increased; an efficiency of added electrical power is deteriorated; and
(d) an amplifier device is increased in size when a size of a transistor is increased.

SUMMARY OF THE INVENTION

An object of the present invention to provide an improved amplifier device in which an output voltage amplitude is increased.

A power amplifier device according to the present invention is characterized in that a bias point of a source-grounded field-effect transistor is set to a higher drain-bias current than that of a class A bias point. In addition, a gradient of the load line is set in such a way that $V_1>V_2$, where $V_1$ is obtained by subtracting a power supply voltage from a voltage attained by a crossing point between the load line and a voltage axis, and $V_2$ is defined by the relation $V_2=V_{dd}-V_{knee}$ where $V_{dd}$ corresponds to power supply voltage and $V_{knee}$ is a knee voltage attained by a crossing point between the load line and a rising part of a drain curent-drain voltage characteristic. Under these circumstances, an input voltage is applied to operate the electrical power amplifier device when an output voltage wave is saturated at a low voltage side of the output voltage wave.

In accordance with another embodiment, there is provided an electrical power amplifier device characterized in that a bias point of a source-grounded field-effect transistor is set to a higher drain-bias current than that of a class A bias point. In addition, a gradient of the load line in respect to a fundamental wave is set such that a voltage $V_1$ obtained by subtracting a power supply voltage from a voltage attained by a crossing point between the load line and a voltage axis and a voltage $V_2$ attained by subtracting a knee voltage V knee from a power supply voltage may have a relation of $V_1>V_2$. Also, a load impedance in respect to a higher harmonic with an even numbered degree is set to become a short-circuited state, a load impedance in respect to a higher harmonic with an odd numbered degree is released and an input voltage is applied to operate the electrical power amplifier device when an output voltage wave is saturated at a low voltage side of the output voltage wave.

In accordance with another embodiment, there is provided an electrical power amplifier device characterized in that a bias point of an emitter-grounded bipolar transistor is set to a higher collector bias current than that of the class A bias point. Further, a gradient of a load line is set in such a way that a relation of $V_1>V_{cc}$ is established between a voltage $V_1$ obtained by subtracting a power supply voltage $V_{cc}$ from a voltage attained from a crossing point between the load line and a voltage axis. Under these circumstances, an input voltage is applied to operate the electrical power amplifier device when an output voltage wave is saturated at a low voltage side of the output voltage wave.

Further, there can be provided in accordance with the present invention an electrical power amplifier device characterized in that a bias point of an emitter-grounded bipolar transistor is set to a higher collector bias current point than that of the class A bias point. Further, a gradient of a load line in respect to a fundamental wave is set in such a way that a relation of $V_1>V$ CC is established, where is a voltage obtained by subtracting a power supply voltage $V_{cc}$ from a voltage attained from a crossing point between the load line and a voltage axis. In addition, a load impedance in respect to a higher harmonic with an even numbered degree is set to be short circuited, a load impedance in respect to a higher harmonic with an odd numbered degree is released, and an input voltage is applied to operate the electrical power amplifier device an output voltage wave is saturated at a low voltage side of the output voltage wave.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1:
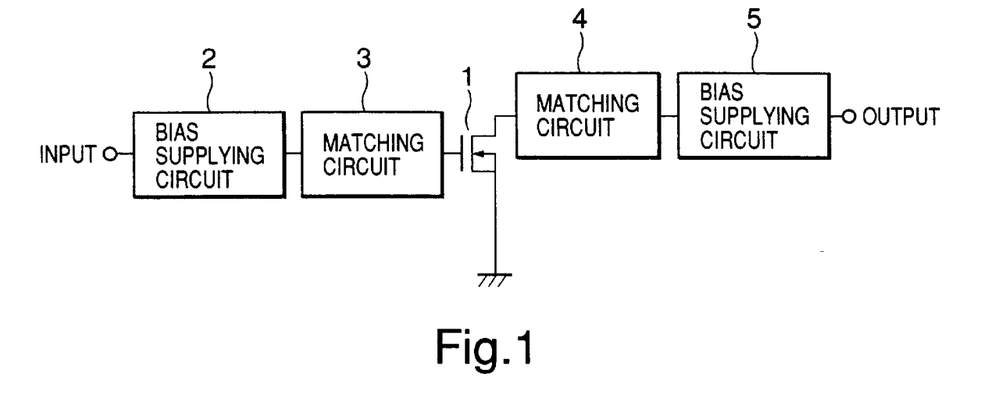
FIG. 1 shows a constitution of an electrical power amplifier device of a first preferred embodiment of the present invention.

An electrical power amplifier device of the first preferred embodiment of the present invention has a constitution shown in FIG. 1. As shown, the electrical power amplifier device of the preferred embodiment includes a source-grounded field-effect transistor (FET) 1; a bias supplying circuit 2 for supplying a gate-bias voltage of FET 1; a matching circuit 3, connected to a gate of FET 1 and the bias supplying circuit 2, for making an optimum load impedance in respect to a fundamental wave; a matching circuit 4, connected to a drain of FET 1, for making an optimum load impedance in respect to the fundamental wave; and a bias supplying circuit 5, connected to the matching circuit 4, for supplying a drain bias voltage of FET 1.

In addition, the electrical power amplifier device of the preferred embodiment determines a bias point and a gradient of a load line as indicated below.

Figure 2:
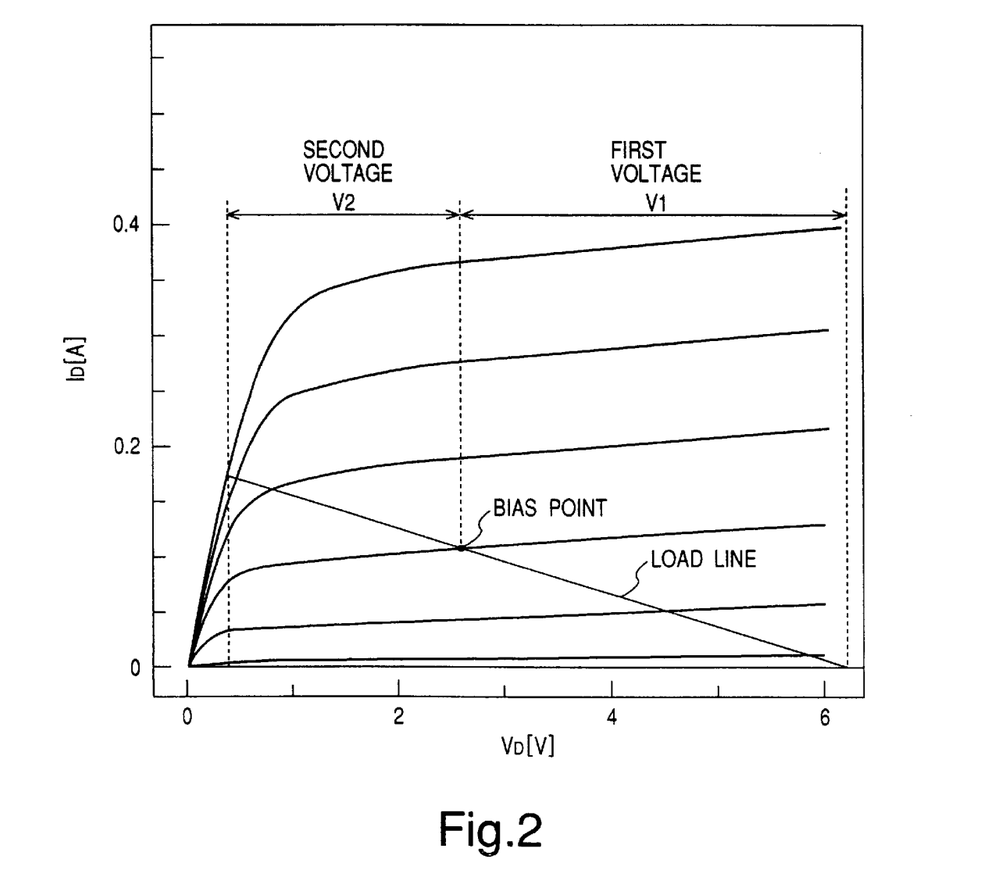
FIG. 2 shows a bias point and a gradient of a load line of an electrical power amplifier device of a first preferred embodiment of the present invention.

That is, the bias point in the preferred embodiment is set to a higher drain-bias current than that of the class A bias point as shown in FIG. 2. Further, a gradient of the load line in the preferred embodiment is set in such a way that the following condition is satisfied. At first, as shown in FIG. 2, a voltage obtained by subtracting a power supply voltage $V_{dd}$ from a voltage attained from a crossing point between the load line and the voltage axis is defined as a first voltage $V_1$. Then, a voltage obtained by subtracting a knee voltage $V_{knee}$ from the power supply voltage $V_{dd}$ is defined as a second voltage $V_2$ ($=V_{dd}-V_{knee}$). In this case, the knee voltage $V_{knee}$ is given at a crossing point between the load line and a rising part of a drain current-drain voltage characteristic. A gradient of the load line is set in such a way that a relation of the first voltage $V_1$>the second voltage $V_2$ may be established under application of the first voltage $V_1$ and the second voltage $V_2$ defined in this way.

In the preferred embodiment of the present invention, an input voltage where an output voltage wave is saturated at a low voltage side in respect to the electrical power amplifier device designed in this way is applied to operate it.

Comparing it with the load line at the electrical power amplifier device (class AB) by the prior art shown in FIG. 12 shows that the load line in the electrical power amplifier device in the preferred embodiment shown in FIG. 2 has a low gradient value. Accordingly, the electrical power amplifier device in the preferred embodiment of the present invention can attain a larger gain than that of the electrical power amplifier device in the prior art by an amount corresponding to a high load resistance. In addition, the electrical power amplifier device in the preferred embodiment of the present invention has a high load resistance, so that it is also possible to restrict a loss caused by the resistance component in the matching circuit to a low value due to a presence of high load resistance.

Figure 3:
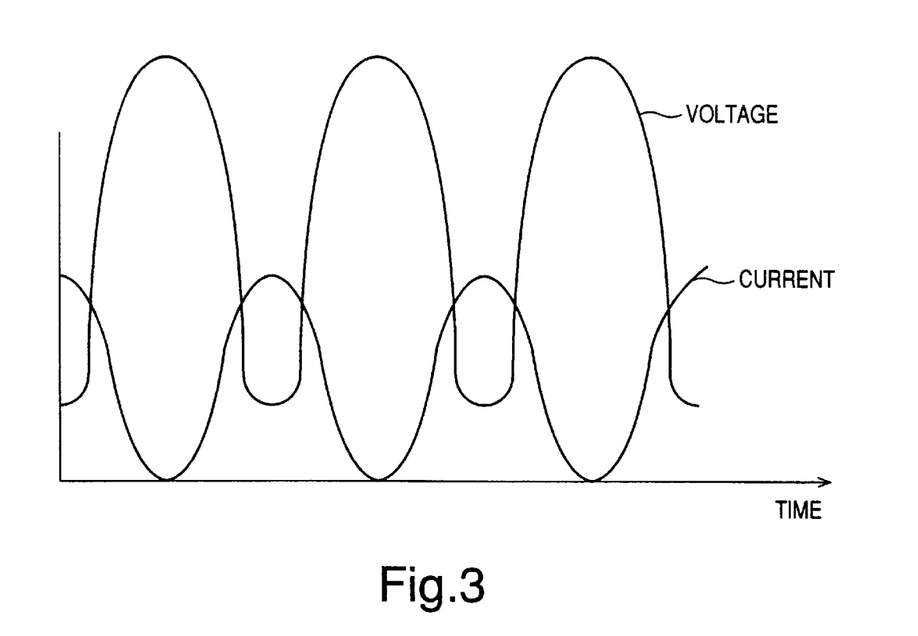
FIG. 3 shows an output voltage waveform and an output current waveform of an electrical power amplifier device of a first preferred embodiment of the present invention.
Figure 6:
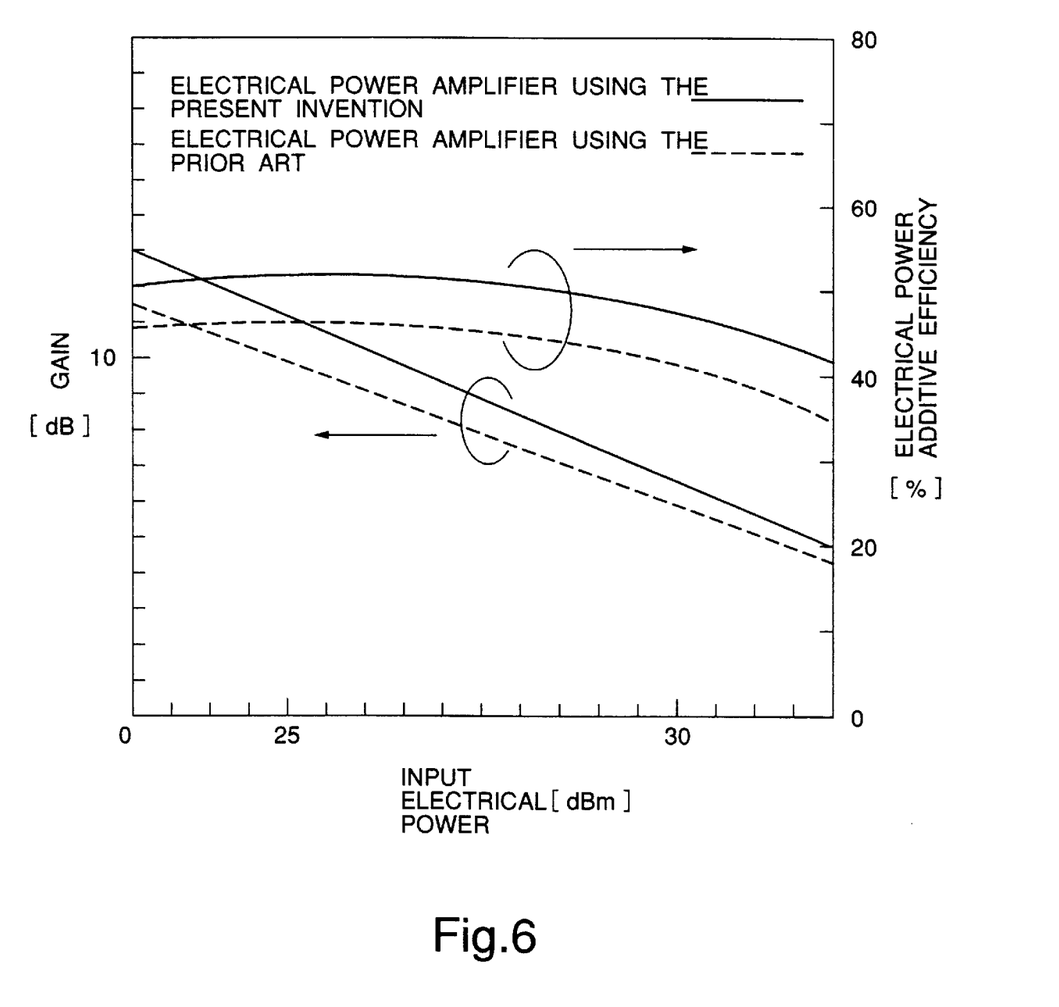
FIG. 6 shows a load electrical power efficiency and a gain in the electrical power amplifier (practical example) and the electrical power amplifier device in the prior art.

In addition, the electrical power amplifier device of the preferred embodiment of the present invention has an output voltage waveform and an output current waveform as shown in FIG. 3. In the prior art electrical power amplifier devices of classes AB, B and C, a saturation may occur at a high voltage side of the output voltage waveform as shown in FIG. 3 and to the contrary, the electrical power amplifier device of the preferred embodiment of the present invention, a saturation may occur at a low voltage side of the output voltage waveform as shown in FIG. 6. Additionally, an output voltage amplitude in the preferred embodiment of the present invention can exceed the maximum value obtained by the prior art, i.e. a value twice of voltage where the knee voltage $V_{knee}$ is subtracted from the power supply voltage $V_{dd}$. As described above, in accordance with the present invention, a high output value can be attained by increasing an output voltage amplitude.

In turn, taking a notice on a product between a current and a voltage shows that either one of the current or the voltage is always near 0 in the preferred embodiment as shown in FIG. 3, so that it becomes possible to attain a high efficiency.

The present invention will be described more practically in reference to one preferred embodiment of. the present invention as follows.

Figure 4:
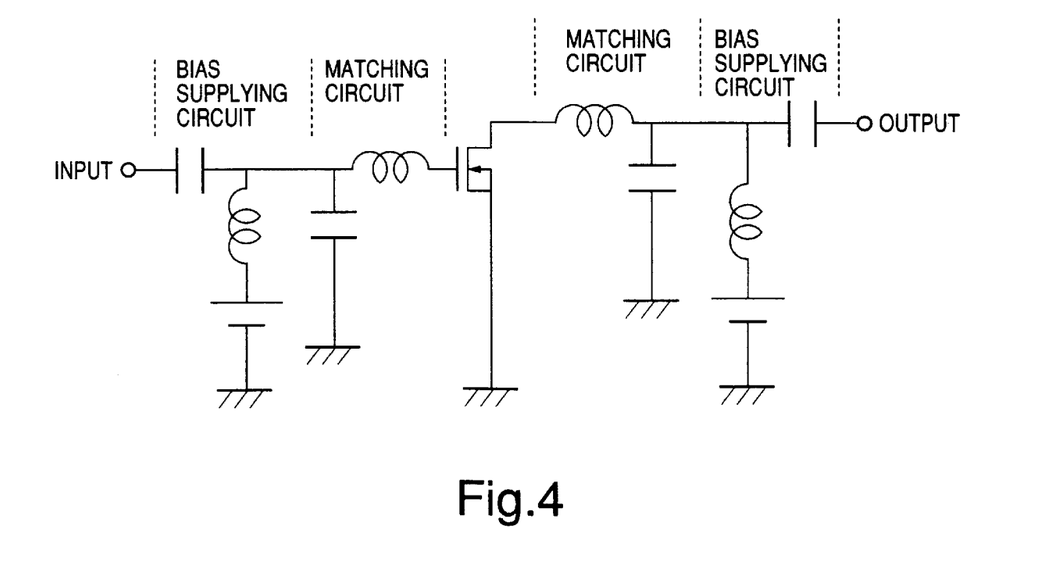
FIG. 4 shows a constitution of one practical example of an electrical power amplifier device of a first preferred embodiment of the present invention.
Figure 5:
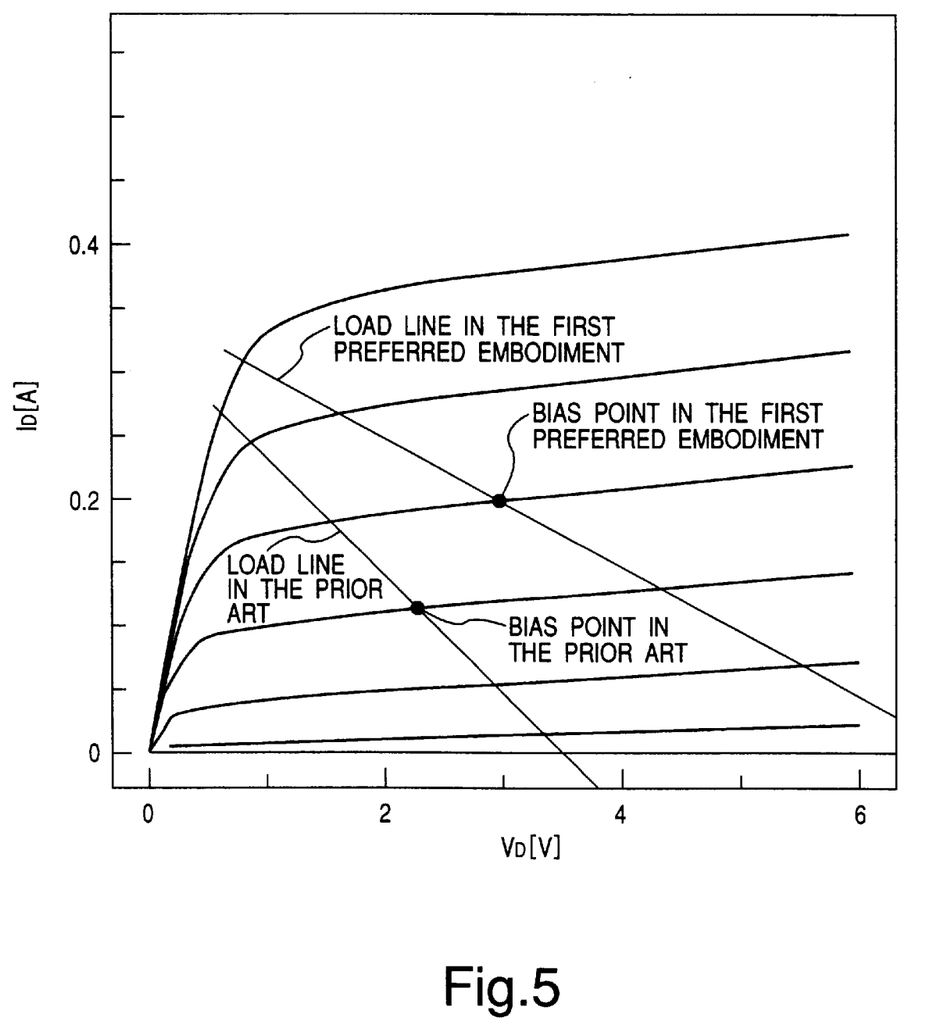
FIG. 5 shows a bias point and a gradient of a load line in the electrical power amplifier device (practical example) of the present invention and the electrical power amplifier device of the prior art.

The electrical power amplifier device of the present preferred embodiment has a constitution shown in FIG. 4. In addition, the electrical power amplifier device of the present preferred embodiment is constructed such that a bias point and a load line are set as shown in FIG. 5. In this case, a drain bias voltage in the electrical power amplifier device in the preferred embodiment is 3V and its gate bias voltage is 2.5V. To the contrary, the drain bias voltage in the electrical power amplifier device using the prior art as an item to be compared is 3V and its gate bias voltage is 1.4V. Also in the preferred embodiment, an input voltage where an output electrical power wave is saturated at a low voltage side is applied in the electrical power amplifier device to operate it.

In addition, a result of a large signal simulation of an input/output electrical power characteristic of each of the electrical power amplifier device of the preferred embodiment and the electrical power amplifier device of the prior art was one shown in FIG. 6.

As shown in FIG. 5, comparing it with the load line in the prior art shows that the load line in the preferred embodiment has a low gradient, i.e. has a high load resistance. Accordingly, it is understood that the electrical power amplifier device in the preferred embodiment of the present invention can attain a higher gain than that of the electrical power amplifier using the prior art as shown in FIG. 6.

Additionally, the electrical power amplifier device of the preferred embodiment of the present invention can attain a higher output electrical power and a higher additional electrical power efficiency than those of the electrical power amplifier device of the prior art.

In addition, the electrical power amplifier device of the preferred embodiment of the present invention can restrict an electrical power loss caused by a resistance of a matching circuit for output lower than that of the electrical power amplifier device using the prior art by an amount corresponding to the high load resistance.

Further, in the case that a transistor having a certain size is provided and it is desired to attain a gain and an output voltage which are equal to those of the electrical power amplifier device of the the prior art. The electrical power amplifier device in the preferred embodiment of the present invention can attain a higher gain and a higher output electrical power than those of the electrical power amplifier device of the prior art. The electrical power device of the preferred embodiment of the present invention accomplishes this by using a transistor having a smaller gate width than that of the transistor used in the electrical power amplifier device of the prior art. That is, the electrical power amplifier device of the present invention attains a small size that compared with that the electrical power amplifier device of the prior art.

Figure 7:
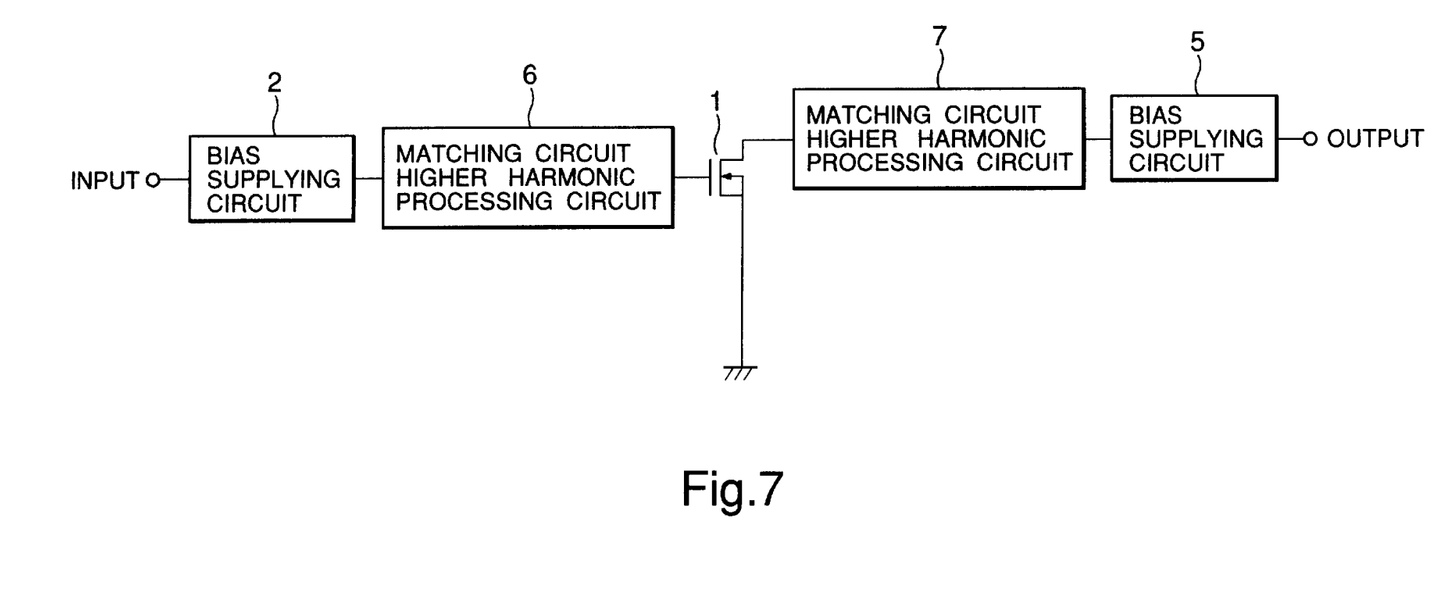
FIG. 7 shows a constitution of an electrical power amplifier device of a second preferred embodiment of the present invention.

Referring to FIG. 7, a second preferred embodiment of the present invention will be described as follows.

The electrical power amplifier device of the preferred embodiment of the present invention is an applied formation of the first preferred embodiment, wherein the component parts of which operations are similar to those of the first preferred embodiment are affixed with the same reference symbols.

In this case, two "matching circuit and higher harmonic processing circuits" 6 and 7 which are indicated in one block, respectively, are collected in one block due to the reason indicated as follows.

"Matching circuit" is a circuit for making an optimum load impedance in respect to a fundamental wave as described in the first preferred embodiment and in turn "the higher harmonic processing circuit" is a circuit for making an optimum load impedance in respect to a higher harmonic.

Accordingly, although these two circuits are circuits having a separate function, in the case that they are actually designed for their circuits, there may be applied several cases of (a) "matching circuit" is mounted at a side near the transistor and "higher harmonic processing circuit" is mounted at a side far from it, (b) "higher harmonic processing circuit" is mounted at a side near the transistor and "matching circuit" is mounted at a side far from it, and (c) "matching circuit" and "higher harmonic processing circuit" are realized by one circuit, resulting in that the preferred embodiment of the present invention can be accomplished by whatever cases may be applied, so the two circuits are collected into one block.

In addition, the electrical power amplifier device of the preferred embodiment of the present invention is operated such that the bias point and the load line in respect to the fundamental wave are determined in the same manner as those of the aforesaid first preferred embodiment as shown in FIG. 2.

Also in respect to the electrical power amplifier device of the preferred embodiment of the present invention, an input voltage where an output voltage wave is saturated at a low voltage side to operate it.

Thus, the electrical power amplifier device of the preferred embodiment of the present invention has a similar effect as that of the electrical power amplifier device of the aforesaid first preferred embodiment.

Further, the electrical power amplifier device of the preferred embodiment of the present invention is operated such that a load impedance against a higher harmonic with an even numbered degree in the higher harmonic processing circuit is short circuited and a load impedance in respect to a higher harmonic with an odd numbered degree is released.

Accordingly, the electrical power amplifier device of the preferred embodiment of the present invention has an output electrical power of higher harmonic of 0 and can have a higher efficiency than that of the electrical power amplifier device in the aforesaid first preferred embodiment.

Figure 8:
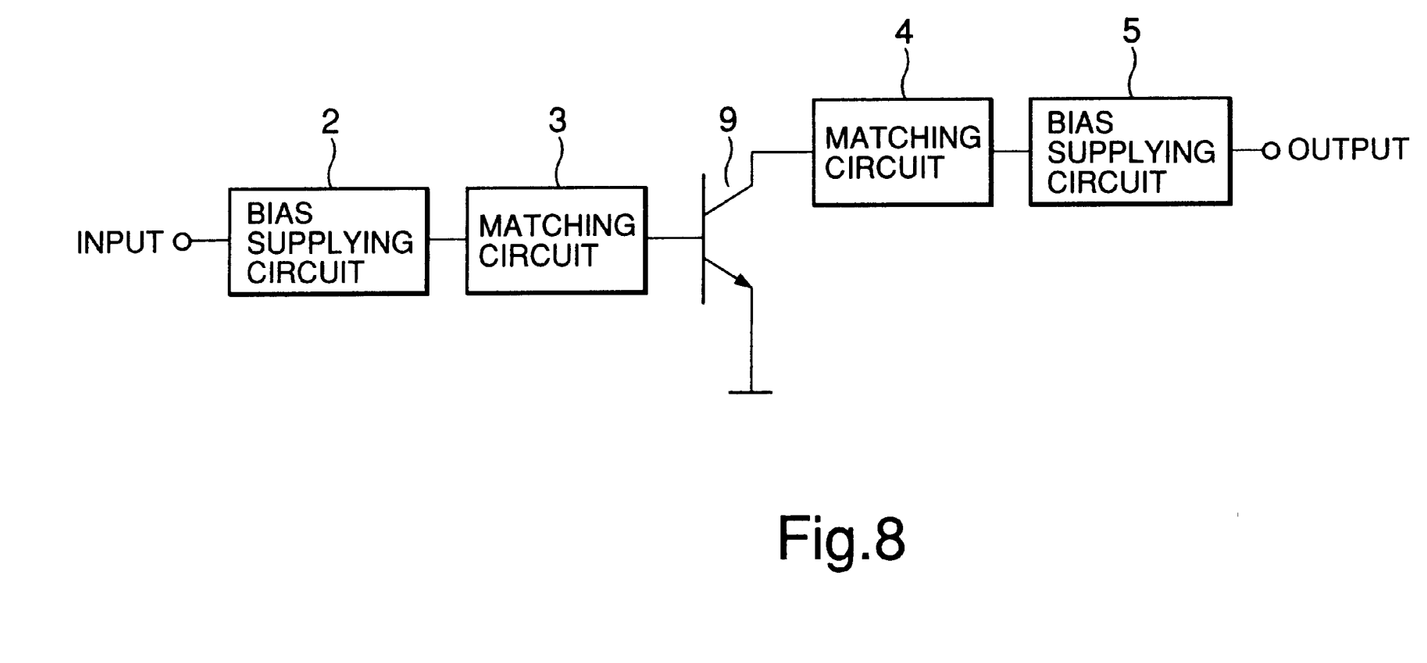
FIG. 8 shows a constitution of an electrical power amplifier device in a third preferred embodiment of the present invention.
Figure 9:
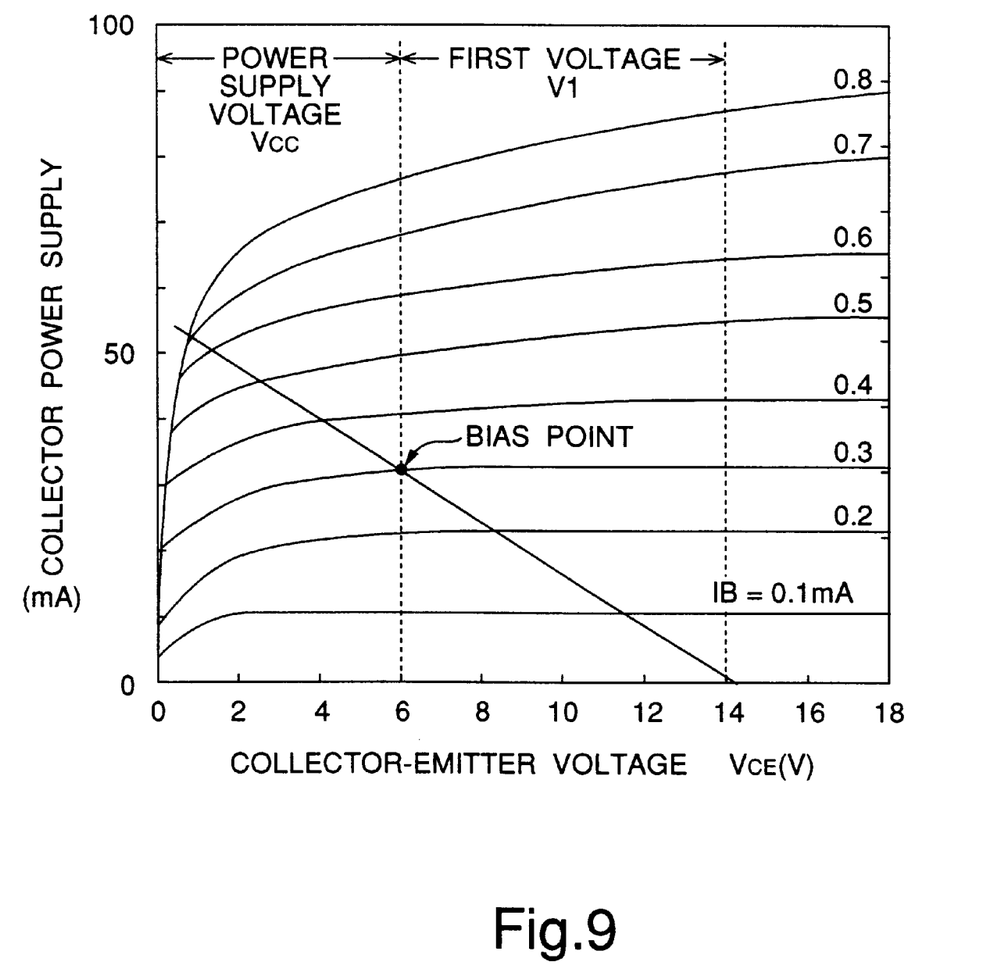
FIG. 9 shows a bias point and a gradient of a load line of an electrical power amplifier device of a third preferred embodiment of the present invention.

Referring to FIGS. 8 and 9, the electrical power amplifier device of the preferred embodiment of the present invention will be described as follows.

As shown in FIG. 8, the electrical power amplifier device of the preferred embodiment of the present invention is constructed such that an emitter-grounded bipolar transistor 9 is used in place of the FET 1 as compared with the first preferred embodiment. Thus, other composing elements are affixed with the same reference symbols as those of FIG. 1.

Further, the electrical power amplifier device of the preferred embodiment of the present invention is constructed such that a bias point and a gradient of a load line are determined as indicated below.

That is, the bias point in the preferred embodiment is set to a point where a higher collector current is attained rather than to the class A bias point as shown in FIG. 9.

In addition, the gradient of the load line in the preferred embodiment of the present invention is set to fulfill the following condition. At first, as shown in FIG. 9, a voltage attained by subtracting a power supply voltage $V_{cc}$ from a voltage obtained from a crossing point between the load line and the voltage axis is defined as a first voltage $V_1$. A gradient of the load line is set under application of the first voltage $V_1$ and the power supply voltage $V_{cc}$ in such a way that a relation of the first voltage $V_1$>the power supply voltage $V_{cc}$ is established. Also in the preferred embodiment of the present invention, although the aforesaid relation is accurately defined as "the first voltage $V_1$>the second voltage $V_2$", the relation of the first voltage $V_1$>the power supply voltage $V_{cc}$ has been set due to the fact that a voltage corresponding to a knee voltage in FET in the bipolar transistor is quite low. Accordingly, the relation of "the first voltage $V_1$>the power supply voltage $V_{cc}$" in the preferred embodiment is meant to include "the first voltage $V_1$>the second voltage $V_2$".

Also in the preferred embodiment of the present invention, it is assumed that an input voltage where an output voltage wave is saturated at a low voltage side is applied to the electrical power amplifier device designed in this way to operate it.

The electrical power amplifier device of the preferred embodiment having such a constitution as described above has a similar effect as that of the electrical power amplifier device of the aforesaid first preferred embodiment.

Figure 10:
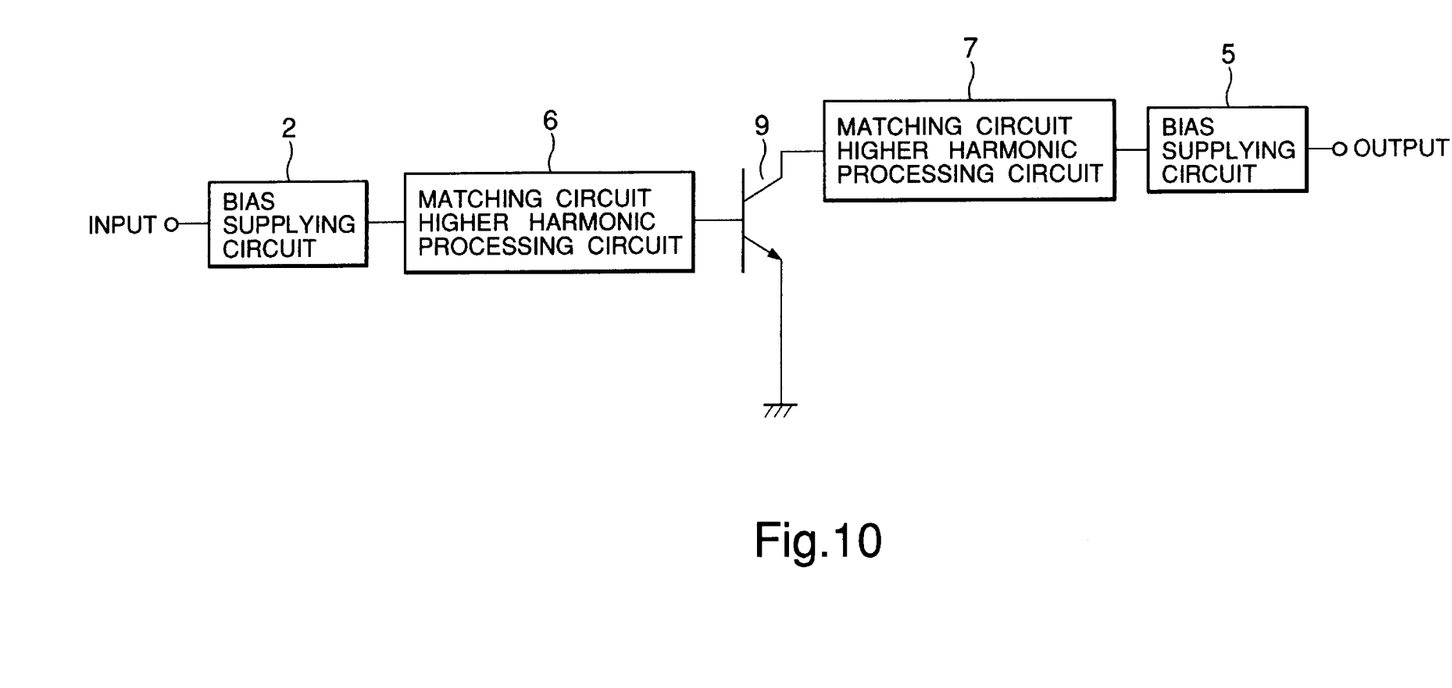
FIG. 10 shows a constitution of an electrical power amplifier device of a fourth preferred embodiment of the present invention.

Referring to FIG. 10, a fourth preferred embodiment of the present invention will be described as follows.

The electrical power amplifier device of the preferred embodiment of the present invention is an applied one of the second and third preferred embodiments, wherein the component parts showing similar operation are affixed by the same reference symbols.

That is, the bias point and the load line in respect to the fundamental wave in the electrical power amplifier device of the preferred embodiment of the present invention are determined in the same manner as that of the aforesaid third preferred embodiment as shown in FIG. 9.

Further, the electrical power amplifier device of the preferred embodiment of the present invention is operated such that a load impedance in respect to a higher harmonic with an even numbered degree is short circuited and a load impedance in respect to a higher harmonic with an odd numbered degree is released in the higher harmonic processing circuit.

Further, an input voltage where an output voltage wave is saturated at a low voltage side even for the electrical power amplifier device of the preferred embodiment of the present invention is applied to operate it.

Since the electrical power amplifier device of the preferred embodiment having such a constitution as one described above has an output electrical power of higher harmonic of 0 as compared with that of the electrical power amplifier of the third preferred embodiment, resulting in that a further higher efficiency can be attained.

As described above, according to the present invention, it is possible to provide an electrical power amplifier device having an increased output voltage amplitude without producing any problems such as reducing of gain, increasing of a loss and making a large-sized device or the like.

It is apparent that the present invention is not limited to the above embodiments but may be changed and modified without departing from the scope and spirit of the invention.

What is claimed is:

1. An electrical power amplifier device, comprising:

a source-grounded field-effect transistor; and means for setting a bias point of the source-grounded field-effect transistor to a higher drain-bias current than that of a class A bias point, in a case where a voltage obtained by subtracting a power supply voltage from a voltage attained from a crossing point between a load line and a voltage axis is defined as a first voltage, a voltage obtained by subtracting a knee voltage given at a crossing point between said load line and a rising part of a drain current-drain voltage characteristic from said power supply voltage is defined as a second voltage, and a gradient of said load line is set in such a way that said first voltage is higher than said second voltage, and wherein an input voltage is applied to operate said electrical power amplifier device when an output voltage wave is saturated at a low voltage side of said output voltage wave.

2. An electrical power amplifier device, wherein a bias point of a source-grounded field-effect transistor to a higher drain bias current than that of a class A bias point, in a case where a voltage obtained by subtracting a power supply voltage from a voltage attained from a crossing point between a load line and a voltage axis is defined as first voltage and a voltage obtained by subtracting a knee voltage attained at a crossing point between said load line and a rising part of a drain current-drain voltage characteristic from said power supply voltage is defined as a second voltage, a gradient of said load line is set in respect to a fundamental wave in such a way that said first voltage is higher than said second voltage, a load impedance in respect to a higher harmonic with an even numbered degree is set to be short circuited, and a load impedance in respect to a higher harmonic with an odd numbered degree is released, and wherein an input voltage is applied to operate said electrical power amplification device when an output voltage wave is saturated at a low voltage side of said output voltage wave.

3. An electrical power amplifier device, comprising:

an emitter-grounded bipolar transistor; and means for setting a bias point of the emitter-grounded bipolar transistor to a higher collector bias current point than that of a class A bias point, in a case where a voltage obtained by subtracting a power supply voltage from a voltage attained from a crossing point between a load line and a voltage axis is defined as a first voltage and a gradient of said load line is set in such a way that said first voltage is increased more than said power supply voltage, and wherein an input voltage is applied to operate said elecrical power amplifier device when an output voltage wave is saturated at a low voltage side of said output voltage wave.

4. An electrical power amplifier device, wherein a bias point of the emitter-grounded bipolar transistor to a higher collector bias current point than that of a class A bias point, in a case where a voltage obtained by subtracting a power supply voltage from a voltage attained from a crossing point between a load line and a voltage axis is defined as first voltage, a gradient of said load line in respect to a fundamental wave is set in such a way that said first voltage is larger than said power supply voltage, a load impedance in respect to a higher harmonic with an even numbered degree is set to be short circuited, and a load impedance in respect to a higher harmonoic with an odd numbered degree is released, and wherein an input voltage is applied to operate said elecrical power amplifier device when an output voltage wave is saturated at a low voltage side of said output voltage wave.

5. The device of claim 1, wherein one of a voltage in said output voltage wave and a current in an output current wave is near zero at all times, to thereby cause said amplifier device to achieve efficient operation.

6. A method for amplifying power in an electrical power amplifier device, said device including a source-grounded field-effect transistor, a first bias supplying circuit for supplying a voltage to a first terminal of the field-effect transistor, a first matching circuit between said first bias supplying circuit and the first terminal of said field-effect transistor, a second matching circuit connected to a second terminal of said field-effect transistor, and a second bias supplying circuit connected to said second matching circuit, said method comprising:

setting a bias point of the source-grounded field-effect transistor to a higher drain-bias current than a class A bias point in accordance with steps which include:
(a) obtaining a first voltage by subtracting a power supply voltage from a voltage attained from a crossing point between a load line and a voltage axis,
(b) obtaining a second voltage by subtracting a knee voltage given at a crossing point between said load line and a rising part of a drain current-drain voltage characteristic from said power supply voltage, and
(c) setting a gradient of said load line in such a way that said first voltage is higher than said second voltage; and applying an input voltage to operate said electrical power amplifier device when an output voltage wave is saturated at a low voltage side of said output voltage wave.

7. A method for amplifying power in an electrical power amplifier device, said device including a source-grounded field-effect transistor, a first bias supplying circuit for supplying a voltage to a first terminal of the field-effect transistor, a first matching circuit between said first bias supplying circuit and the first terminal of said field-effect transistor, a second matching circuit connected to a second terminal of said field-effect transistor, and a second bias supplying circuit connected to said second matching circuit, said method comprising:

setting a bias point of the source-grounded field-effect transistor to a higher drain-bias current than a class A bias point in accordance with steps which include:
(a) obtaining a first voltage by subtracting a power suply voltage from a voltage attained from a crossing point between a load line and a voltage axis,
(b) obtaining a second voltage by subtracting a knee voltage attained at a crossing point between said load line and a rising part of a drain current-drain voltage characteristic from said power supply voltage,
(c) setting a gradient of said load line is set in respect to a fundamental wave in such a way that said first voltage is higher than said second voltage;

setting a load impedance in respect to a higher harmonic with an even numbered degree to be short circuited;

releasing a load impedance in respect to a higher harmonic with an odd numbered degree; and applying an input voltage to operate said electrical power amplification device when an output voltage wave is saturated at a low voltage side of said output voltage wave.

8. A method for amplifying power in an electrical power amplifier device, said device including an emitter-grounded bipolar transistor, a first bias supplying circuit for supplying a voltage to a first terminal of the field-effect transistor, a first matching circuit and harmonic processing circuit between said first bias supplying circuit and the first terminal of said field-effect transistor, a second matching circuit and harmonic processing circuit connected to a second terminal of said field-effect transistor, and a second bias supplying circuit connected to said second matching circuit, said method comprising:

setting a bias point of the emitter-grounded bipolar transistor to a higher collector-bias current point than a class A bias point in accordance with steps which include:
(a) obtaining a first voltage by subtracting a power supply voltage from a voltage attained from a crossing point between a load line and a voltage axis, and
(b) setting a gradient of said load line in such a way that said first voltage is increased more than said power supply voltage; and applying an input voltage to operate said elecrical power amplifier device when an output voltage wave is saturated at a low voltage side of said output voltage wave.

9. A method for amplifying power in an electrical power amplifier device, said device including an emitter-grounded bipolar transistor, a first bias supplying circuit for supplying a voltage to a first terminal of the field-effect transistor, a first matching circuit and harmonic processing circuit between said first bias supplying circuit and the first terminal of said field-effect transistor, a second matching circuit and harmonic processing circuit connected to a second terminal of said field-effect transistor, and a second bias supplying circuit connected to said second matching circuit, said method comprising:

setting a bias point of the emitter-grounded bipolar transistor to a higher collector-bias current point than a class A bias point in accordance with steps which include:
(a) obtaining a first voltage by subtracting a power supply voltage from a voltage attained from a crossing point between a load line and a voltage axis,
(b) setting a gradient of said load line in respect to a fundamental wave in such a way that said first voltage is larger than said power supply voltage;

setting a load impedance in respect to a higher harmonic with an even numbered degree to be short circuited;

releasing a load impedance in respect to a higher harmonoic with an odd numbered degree; and applying an input voltage to operate said elecrical power amplifier device when an output voltage wave is saturated at a low voltage side of said output voltage wave.

* * * * *